(12) United States Patent
Hu

(10) Patent No.: US 10,141,433 B2
(45) Date of Patent: Nov. 27, 2018

(54) METHOD OF MANUFACTURING THIN FILM TRANSISTOR

(71) Applicant: Wuhan China Star Optoelectronics Technology Co., Ltd., Wuhan, Hubei (CN)

(72) Inventor: Junyan Hu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 213 days.

(21) Appl. No.: 15/118,881

(22) PCT Filed: Jun. 30, 2016

(86) PCT No.: PCT/CN2016/087861
§ 371 (c)(1),
(2) Date: Aug. 13, 2016

(87) PCT Pub. No.: WO2017/215043
PCT Pub. Date: Dec. 21, 2017

(65) Prior Publication Data
US 2018/0175177 A1    Jun. 21, 2018

(30) Foreign Application Priority Data
Jun. 15, 2016  (CN) .......................... 2016 1 0417495

(51) Int. Cl.
H01L 29/66    (2006.01)
H01L 29/786   (2006.01)
H01L 21/34    (2006.01)

(52) U.S. Cl.
CPC ........ H01L 29/66969 (2013.01); H01L 21/34 (2013.01); H01L 29/66765 (2013.01);
(Continued)

(58) Field of Classification Search
None
See application file for complete search history.

(56) References Cited

U.S. PATENT DOCUMENTS 4,862,234 A    8/1989 Koden
9,741,752 B1 * 8/2017 Hu ...................... H01L 27/1225
(Continued)

FOREIGN PATENT DOCUMENTS

CN    1056187 A    11/1991
CN    101478005 A   7/2009
(Continued)

Primary Examiner — Alexander Ghyka
(74) Attorney, Agent, or Firm — Andrew C. Cheng

(57) ABSTRACT

The present application discloses a method of manufacturing a thin film transistor, including following steps: forming a gate electrode on the top surface of the substrate; depositing a gate insulating layer, a semiconductor material and an etching stop layer sequentially on the gate electrode; patterning the etching stop layer by a first mask to form a stopper; depositing a second metal layer; using a second mask and a photoresist to form a source electrode region, a drain electrode region and a channel region on the surface of the second metal layer; etching the periphery region of the source electrode region, the drain electrode region and the channel region to expose the gate insulating layer; removing the photoresist and etching the second metal layer within the channel, and form a source electrode and a drain electrode by the remaining second metal layer; and irradiating the bottom of the substrate.

10 Claims, 4 Drawing Sheets

(52) U.S. Cl.
CPC ...... *H01L 29/786* (2013.01); *H01L 29/78618* (2013.01); *H01L 29/78693* (2013.01); *H01L 29/78696* (2013.01)

(56) References Cited

U.S. PATENT DOCUMENTS

| | | | | |
|---|---|---|---|---|
| 2010/0032680 | A1* | 2/2010 | Kaitoh | G02F 1/1368 257/72 |
| 2010/0264420 | A1* | 10/2010 | Honda | H01L 29/41733 257/66 |
| 2011/0263087 | A1* | 10/2011 | Asami | H01L 21/28273 438/266 |
| 2011/0278565 | A1* | 11/2011 | Yim | H01L 29/7869 257/43 |
| 2015/0115263 | A1* | 4/2015 | Yamazaki | H01L 29/7869 257/43 |
| 2015/0311233 | A1* | 10/2015 | Hsin | H01L 27/1225 257/43 |
| 2016/0197191 | A1* | 7/2016 | Cao | H01L 27/1225 257/43 |

FOREIGN PATENT DOCUMENTS

| | | |
|---|---|---|
| CN | 103988307 A | 8/2014 |
| CN | 104637950 A | 5/2015 |
| KR | 101051004 B1 | 7/2011 |

\* cited by examiner

METHOD OF MANUFACTURING THIN FILM TRANSISTOR

CROSS REFERENCE

This application claims the priority of Chinese Patent Application No. 201610417495.7, entitled "METHOD OF MANUFACTURING THIN FILM TRANSISTOR", filed on Jun. 15, 2016, the disclosure of which is incorporated herein by reference in its entirety

FIELD OF THE INVENTION

The present application relates to a display technology field, and more particularly to a method of manufacturing thin film transistor.

BACKGROUND OF THE INVENTION

In recent years, a metal oxide thin film transistor attaches more and more attention since its advantage of high mobility, good transparency, stable thin film structure, the low manufacturing temperature and low cost. Especially the indium gallium zinc oxide, In—Ga—Zn—O, IGZO as the representative of the metal oxide TFT, with high compatibility with the currently manufacturing process of the a-Si TFT, thereby obtaining a wide range of applications of the manufacturing the large size OLED panel.

The method of manufacturing thin film transistor in conventional includes four mask steps, namely:
forming a gate electrode on a substrate by using the first mask;
forming an active layer pattern by using the second mask;
forming an etching stop layer pattern by using the third mask; and
forming a drain electrode and a source electrode patterns by using the fourth mask.

Therefore, how to save costs of the mask and simplify the process is the issues for continued research in the industry.

SUMMARY OF THE INVENTION

The embodiment of the present application discloses a method of manufacturing thin film transistor to save costs of the mask and simplify the process.

A method of manufacturing thin film transistor provided in an embodiment of the present application, includes the following steps.

A step of depositing a first metal layer on the top surface of the substrate, and patterning the first metal layer to form a gate electrode.

A step of depositing a gate insulating layer, a semiconductor material and an etching stop layer sequentially on the gate electrode.

A step of patterning the etching stop layer by a first mask to form a stopper directly above gate electrode.

A step of depositing a second metal layer, the second metal layer covers the stopper and the semiconductor material.

A step of using a second mask and a photoresist to form a source electrode region, a drain electrode region and a channel region on the surface of the second metal layer.

A step of etching the periphery region of the source electrode region, the drain electrode region and the channel region to expose the gate insulating layer.

A step of removing the photoresist and etching the second metal layer within the channel, and form a source electrode and a drain electrode by the remaining second metal layer.

A step of irradiating the bottom of the substrate by UV light to enhance the conductivity of the region of the semiconductor material contacted with the source electrode and the drain electrode.

Wherein the material of the semiconductor material is amorphous indium gallium zinc oxide, and is deposited by a sputtering apparatus at room temperature.

Wherein the process of removing the photoresist and etching the second metal layer within the channel, and form a source electrode and a drain electrode by the remaining second metal layer further includes the following steps.

A step of ashing and cleaning the photoresist within the channel by the method of ashing and expose the second metal layer;

A step of etching the second metal layer within the channel.

A step of stripping all of the remaining photoresist.

Wherein in the patterning process of the etching stop layer by the first mask layer, the pattern of the gate electrode is taken as a base, the pattern of the stopper is same with the pattern of the gate electrode, and in the process of forming the stopper by the first mask layer, is exposed from the bottom side of the substrate.

Wherein the second mask is a semitransparent mask.

Wherein the material of the etching stop layer is silicon nitride (SiNx) material, or silicon oxide (SiOx) material, or a composite layer made of the silicon oxide material or silicon nitride material.

Wherein the material of the first metal layer including one or more than one material selected from Al, Mo, Cu, Ag, Cr, Ti, AlNi, MoTi.

Wherein the substrate is a glass substrate.

Wherein the material of the substrate including silica, mica, alumina, or one or more than one material selected from transparent plastic or insulating material.

Wherein the material of the gate insulating layer including silicon oxide material.

In the manufacturing process of the method of manufacturing thin film transistor in the present application, only use two masks includes a first mask (having a pattern of the shape of the gate electrode, also known as a gate electrode mask) and second mask (as a semitransparent mask) respectively. By using the gate electrode mask to form the stopper, and using the semitransparent mask to form the source electrode region, the drain electrode region and the channel region, and then the UV light irradiation from the bottom side of the substrate to enhance the conductivity of the region of the semiconductor material contacted with the source electrode and the drain electrode. The technical solution provided in the present application, the number of masks used in the manufacturing process is less than that in the manufacturing process of the conventional technology, the conventional technology need to use four masks; therefore, the present application can save cost and simplify the process.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

FIGS. 1 to 7 are schematic structures of the method of manufacturing thin film transistor in a preferred embodiment of the present application.

Figure 1:
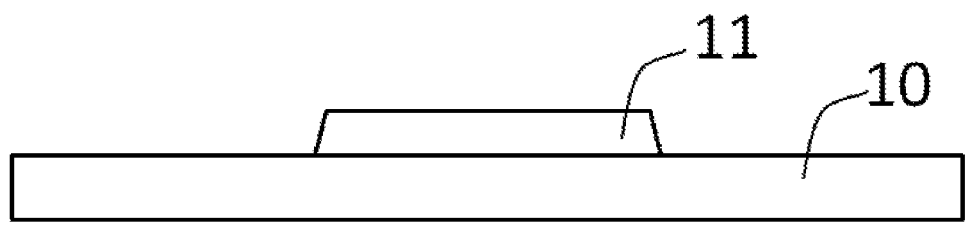
FIG. 1 is a schematic structure of the method of manufacturing thin film transistor to form a gate electrode on a substrate in a preferred embodiment of the present application.

Referring to FIG. 1 a substrate 10 is provided, and clean the substrate 10, a first metal layer is deposited on the top surface of the substrate 10, and patterned the first metal layer to form a gate electrode 11. In one embodiment, the substrate 10 is a glass substrate. The material of the substrate 10 can also include silica, mica, alumina, or one or more than one material selected from the transparent plastic or insulating material. The substrate 10 is an insulating layer substrate can reduce the high frequency loss of the substrate. The material of the first metal layer (i.e. the material of the gate electrode 11) includes one or more than one material selected from Al, Mo, Cu, Ag, Cr, Ti, AlNi, MoTi. In one embodiment, the thickness of the gate electrode 11 is 1500 to 6000 angstroms.

Figure 2:
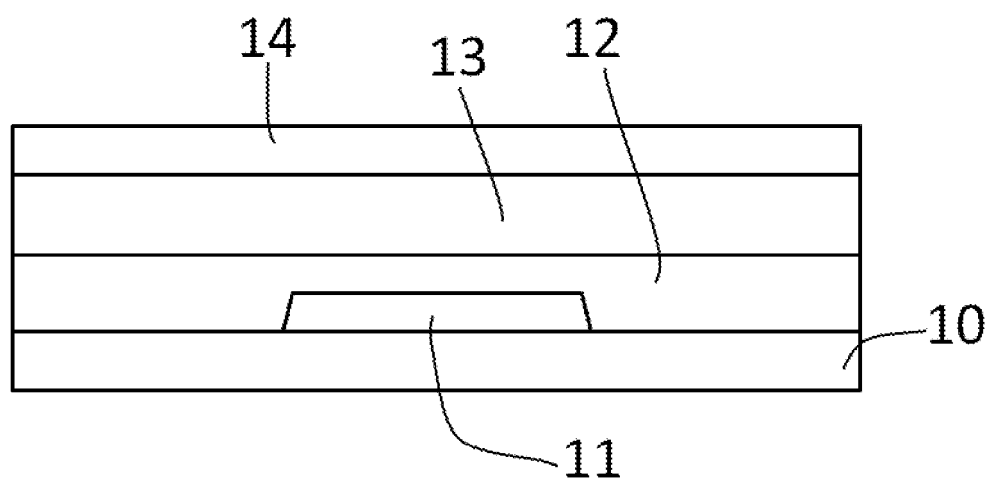
FIG. 2 is a schematic structure of the method of manufacturing thin film transistor to form a stopper as a gate insulating layer on the gate electrode, semiconductor material and an etching stop layer in a preferred embodiment of the present application.

Referring to FIG. 2, a gate insulating layer 12, a semiconductor material 13 and an etching stop layer 14 are sequentially deposited on the gate electrode 11. The semiconductor layer formed by the semiconductor material 13 is also referred to a channel layer or an active layer. Preferably, the semiconductor material 13 is a metal oxide semiconductor layer, the metal oxide semiconductor layer can include but not limited to one or more following materials of: ZnO based transparent oxide semiconductor materials, SnO2 based transparent oxide semiconductor materials, In2O3 based transparent oxide semiconductor materials. For example, the semiconductor material 13 is amorphous indium gallium zinc oxide, a-IGZO, and is deposited by a sputtering apparatus at room temperature.

The material of the etching stop layer is silicon nitride (SiNx) material, or silicon oxide (SiOx) material, or a composite layer made of the silicon oxide material or silicon nitride material. The material of the gate insulating layer includes silicon oxide material, the thickness of the gate insulating layer can be 1,500 to 4,000 angstroms.

Figure 3:
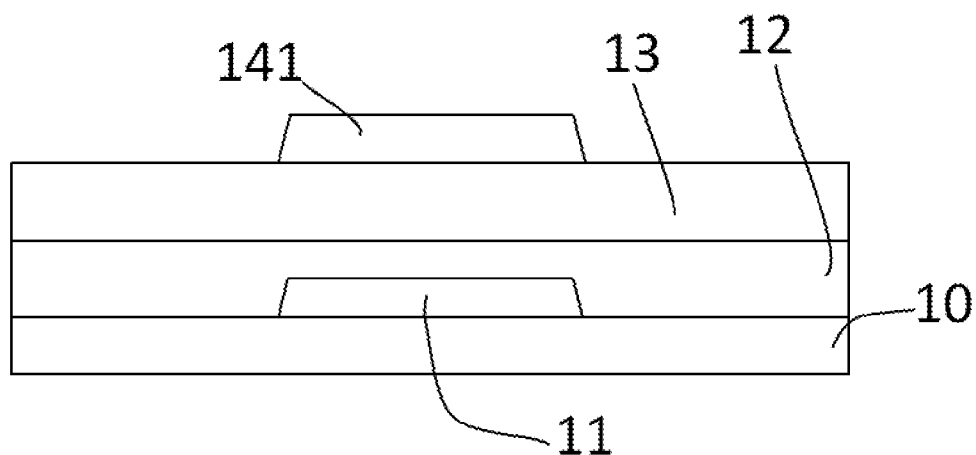
FIG. 3 is a schematic structure of the method of manufacturing thin film transistor to form a stopper in a preferred embodiment of the present application.

Referring to FIG. 3, patterning the etching stop layer 14 by a first mask to form a stopper 141 directly above gate electrode 11. Specifically, in the patterning process of the etching stop layer 14 by the first mask layer, the pattern of the gate electrode 11 is taken as a base, the pattern of the stopper 141 is same with the pattern of the gate electrode 11, and in the process of forming the stopper by the first mask layer, is exposed from the bottom side of the substrate 10.

Figure 4:
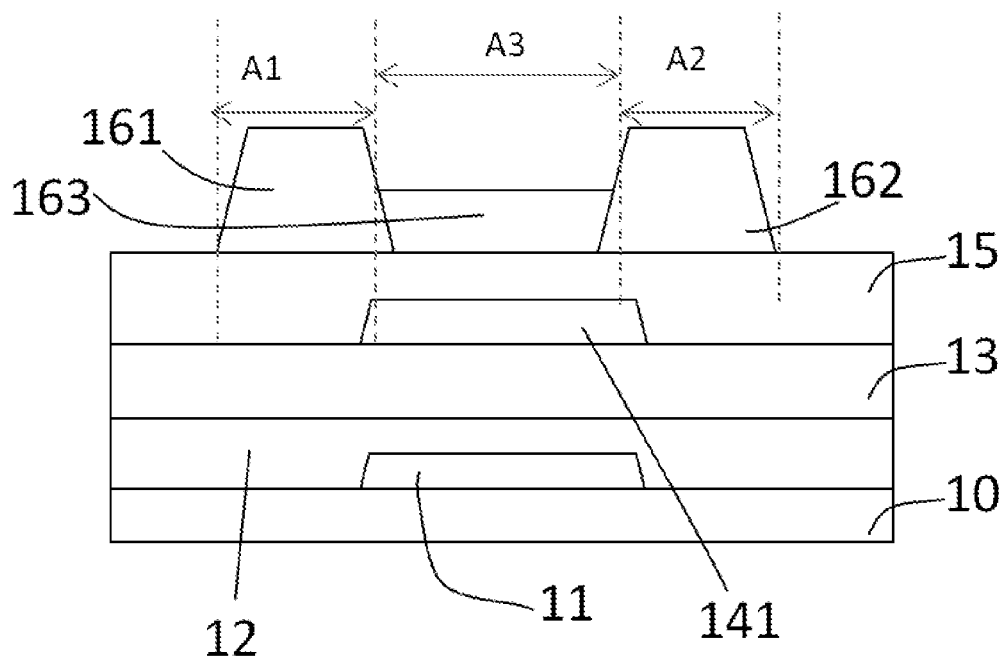
FIG. 4 is a schematic structure of the method of manufacturing thin film transistor to deposit a second metal layer and forming a source electrode region, a drain electrode region and a channel region in a preferred embodiment of the present application.

Referring to FIG. 4, a second metal layer 15 is deposited and covers the stopper and the semiconductor material. The material of the second metal layer 15 include but are not limited to one or more than one metal materials selected from Al, Mo, Cu, Ag, Cr, Ti, AlNi, MoTi.

Using a second mask 15 and a photoresist to form a source electrode region 161 (marked as A1 region illustrated in FIG. 4), a drain electrode region 162 (marked as A2 region illustrated in FIG. 4) and a channel region 163 (marked as A3 region illustrated in FIG. 4) on the surface of the second metal layer 15; the second mask is a semitransparent mask.

Figure 5:
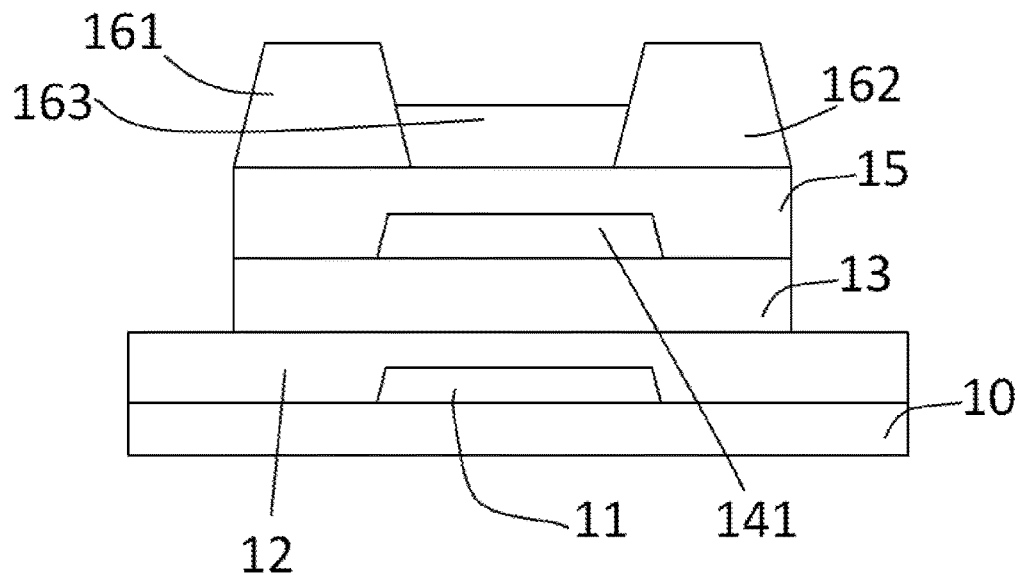
FIG. 5 is a schematic structure of the method of manufacturing thin film transistor to etch the periphery region of the source electrode region, the drain electrode region and the channel region and expose the gate insulating layer in a preferred embodiment of the present application.

Referring to FIG. 5, etching the periphery region of the source electrode region 161, the drain electrode region 162 and the channel region 163 to expose the gate insulating layer 12 as illustrated in FIG. 5, the partial surface of the gate insulating layer 12 remote from the substrate 10 is exposed, the exposed regions surrounding the semiconductor material 13 and the second metal layer 15.

Figure 6:
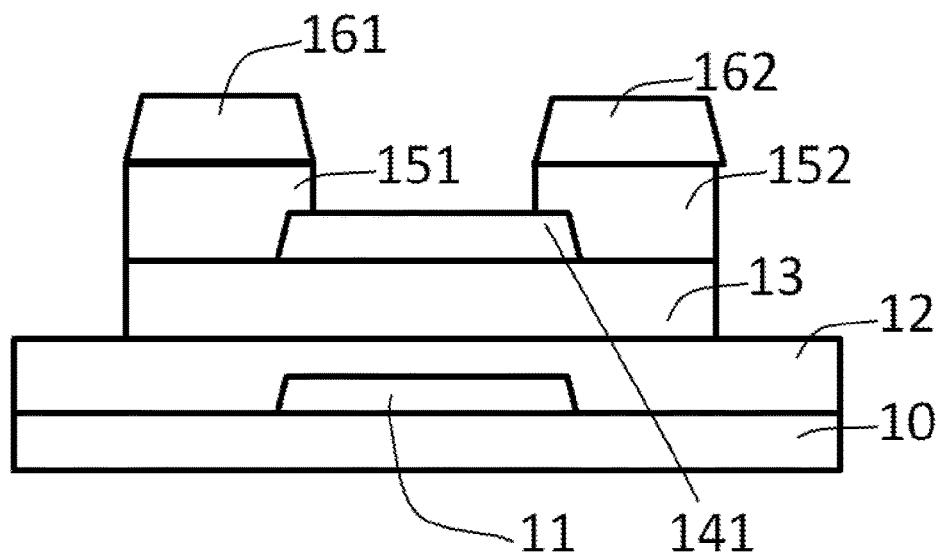
FIG. 6 is a schematic structure of the method of manufacturing thin film transistor to ash and clean the photoresist in the channel by ashing and expose the second metal layer in a preferred embodiment of the present application.
Figure 7:
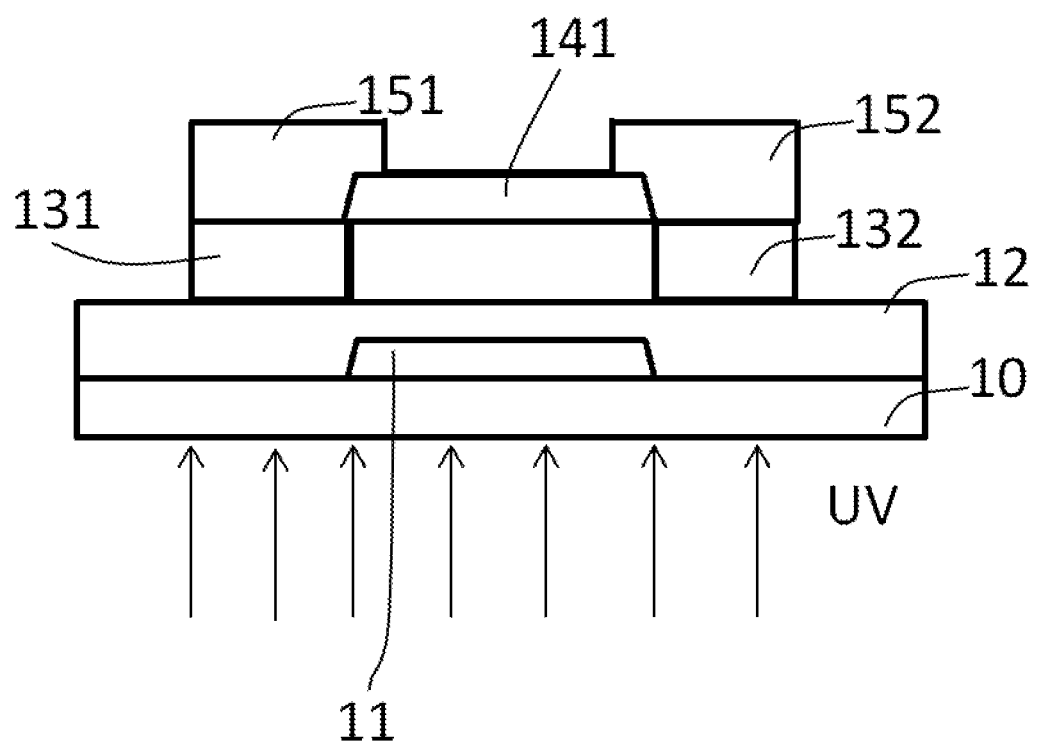
FIG. 7 is a schematic structure of the method of manufacturing thin film transistor to UV irradiate the bottom of the substrate after removing the photoresist to enhance the conductivity of the region of the semiconductor material contacted with the source electrode and the drain electrode in a preferred embodiment of the present application

Referring to the FIGS. 6-7, the photoresist is removed and etching the second metal layer 15 within the channel, and the remaining second metal layer 15 forms a source electrode 151 and a drain electrode 152. In particular, the photoresist within the channel is ash and clean by the method of ashing and expose the second metal layer 15; and further etching the second metal layer 15 within the channel, and expose the stopper 141 (as illustrated in FIG. 6); all of the remaining photoresist is stripped at last (the portions marked as 161 and 162 in FIG. 6).

As illustrated in FIG. 7, the bottom of the substrate is irradiated by UV light (the line with arrow in the bottom of the substrate shows as the UV light) to enhance the conductivity of the region of the semiconductor material 13 contacted with the source electrode 151 and the drain electrode 152, i.e. by UV light irradiation, the semiconductor material 13 is formed a first electrically conductive region 131, a second electrically conductive region 132 and a middle region (not numbered) between the first electrically conductive region 131 and the second electrically conductive region 132. The first electrically conductive region 131 is in contact with the source electrode 151, a second electrically conductive region 132 is in contact with the drain electrode 152.

In the manufacturing process of the method of manufacturing thin film transistor in the present application, only use two masks includes a first mask (having a pattern of the shape of the gate electrode, also known as a gate electrode mask) and second mask (as a semitransparent mask) respectively. By using the gate electrode mask to form the stopper 141, and using the semitransparent mask to form the source electrode region, the drain electrode region and the channel region, and then the UV light irradiation from the bottom side of the substrate to enhance the conductivity of the region of the semiconductor material 13 contacted with the source electrode 151 and the drain electrode 152. The technical solution provided in the present application, the number of masks used in the manufacturing process is less than that in the manufacturing process of the conventional technology, the conventional technology need to use four masks, therefore, the present application can save cost and simplify the process.

Above are embodiments of the present application, which does not limit the scope of the present application. Any modifications, equivalent replacements or improvements within the spirit and principles of the embodiment described above should be covered by the protected scope of the invention.

What is claimed is:

1. A method of manufacturing a thin film transistor, comprising the steps of:
    depositing a first metal layer on the top surface of the substrate, and patterning the first metal layer to form a gate electrode;
    depositing a gate insulating layer, a semiconductor material and an etching stop layer sequentially on the gate electrode;
    patterning the etching stop layer by a first mask to form a stopper directly above gate electrode;
    depositing a second metal layer covering the stopper and the semiconductor material;
    using a second mask and a photoresist to form a source electrode region, a drain electrode region and a channel region on the surface of the second metal layer;
    etching the periphery region of the source electrode region, the drain electrode region and the channel region to expose the gate insulating layer;
    removing the photoresist and etching the second metal layer within the channel, and forming a source electrode and a drain electrode by the remaining second metal layer; and
    irradiating the bottom of the substrate by UV light to enhance the conductivity of the region of the semiconductor material contacted with the source electrode and the drain electrode.

2. The method of manufacturing a thin film transistor according to claim 1, wherein the material of the semiconductor material is amorphous indium gallium zinc oxide, and is deposited by a sputtering apparatus at room temperature.

3. The method of manufacturing a thin film transistor according to claim 2, wherein the process of removing the photoresist and etching the second metal layer within the channel, and forming a source electrode and a drain electrode by the remaining second metal layer" further comprising the steps of:
    ashing and cleaning the photoresist within the channel by the method of ashing and expose the second metal layer;
    etching the second metal layer within the channel; and
    stripping all of the remaining photoresist.

4. The method of manufacturing a thin film transistor according to claim 3, wherein in the patterning process of the etching stop layer by the first mask layer, the pattern of the gate electrode is taken as a base, the pattern of the stopper is same with the pattern of the gate electrode, and in the process of forming the stopper by the first mask layer, is exposed from the bottom side of the substrate.

5. The method of manufacturing a thin film transistor according to claim 4, wherein the second mask is a semitransparent mask.

6. The method of manufacturing a thin film transistor according to claim 5, wherein the material of the etching stop layer is silicon nitride ($SiN_x$) material, or silicon oxide ($SiO_x$) material, or a composite layer made of the silicon oxide material or silicon nitride material.

7. The method of manufacturing a thin film transistor according to claim 5, wherein the material of the first metal layer comprising one or more than one material selected from Al, Mo, Cu, Ag, Cr, Ti, AlNi, MoTi.

8. The method of manufacturing a thin film transistor according to claim 5, wherein the substrate is a glass substrate.

9. The method of manufacturing a thin film transistor according to claim 5, wherein the material of the substrate comprising silica, mica, alumina, or one or more than one material selected from transparent plastic or insulating material.

10. The method of manufacturing a thin film transistor according to claim 5, wherein the material of the gate insulating layer comprising silicon oxide material.

\* \* \* \* \*